United States Patent [19]

Ishigaki

[11] Patent Number: 4,626,788

[45] Date of Patent: Dec. 2, 1986

[54] CIRCUIT FOR RECONSTRUCTING NOISE-AFFECTED SIGNALS

[75] Inventor: Yukinobu Ishigaki, Tokyo, Japan

[73] Assignee: Victor Company of Japan, Limited, Japan

[21] Appl. No.: 516,242

[22] Filed: Jul. 21, 1983

[30] Foreign Application Priority Data

Jul. 21, 1982 [JP] Japan .................................. 57-127204
Jul. 21, 1982 [JP] Japan .................................. 57-127205
Jul. 30, 1982 [JP] Japan .................................. 57-133296
Jul. 30, 1982 [JP] Japan .................................. 57-133297

[51] Int. Cl.$^4$ .......................... H03B 1/00; H03B 1/04; H03K 5/00
[52] U.S. Cl. .................................... 328/165; 328/151; 328/163; 328/149; 328/21; 455/304
[58] Field of Search ................. 307/268, 264; 328/163, 328/165, 147, 149; 375/104, 58; 455/304

[56] References Cited

U.S. PATENT DOCUMENTS

| | | | |
|---|---|---|---|
| 3,689,845 | 9/1972 | Hepp .................................. | 325/473 |
| 4,076,969 | 7/1983 | Sacks .................................. | 179/100.4 D |
| 4,143,333 | 3/1979 | Jacobsen et al. ................... | 330/149 |
| 4,156,202 | 5/1979 | Takahashi ........................... | 328/163 |
| 4,192,003 | 3/1980 | Brock et al. ........................ | 364/487 |
| 4,204,170 | 5/1980 | Kage .................................... | 328/165 |
| 4,220,926 | 9/1980 | Buckner .............................. | 328/165 |
| 4,311,963 | 1/1982 | Watanabe ............................ | 328/163 |
| 4,314,377 | 2/1982 | Kondo et al. ....................... | 455/223 |

FOREIGN PATENT DOCUMENTS 2929030 2/1980 Fed. Rep. of Germany .

Primary Examiner—Stanley D. Miller
Assistant Examiner—Richard Roseen
Attorney, Agent, or Firm—Lowe, Price, LeBlanc Becker & Shur

[57] ABSTRACT

An analog signal which is affected by impulse noise is applied to a timing circuit that generates a sampling pulse in response to a noise impulse introduced in the desired signal. This noise-affected signal is also applied to a holding circuit which passes it in the absence of the sampling pulse and holds it in the presence of the sampling pulse to derive therefrom a modified analog signal. A differentiator generates a signal representative of the time-varying rate of the analog signal. A sampling circuit samples the rate representative signal in response to the sampling pulse and holds the sampled signal for the duration of the sampling pulse to derive therefrom a rectangular pulse, so that the amplitude and polarity of the rectangular pulse represent the gradient and polarity of the noise-affected portion of the signal. The rectangular pulse is integrated linearly at a rate variable as a function of the amplitude of the rectangular pulse to generate a ramp voltage. An adder combines the ramp voltage with the modified signal to generate a reconstructed signal.

7 Claims, 11 Drawing Figures

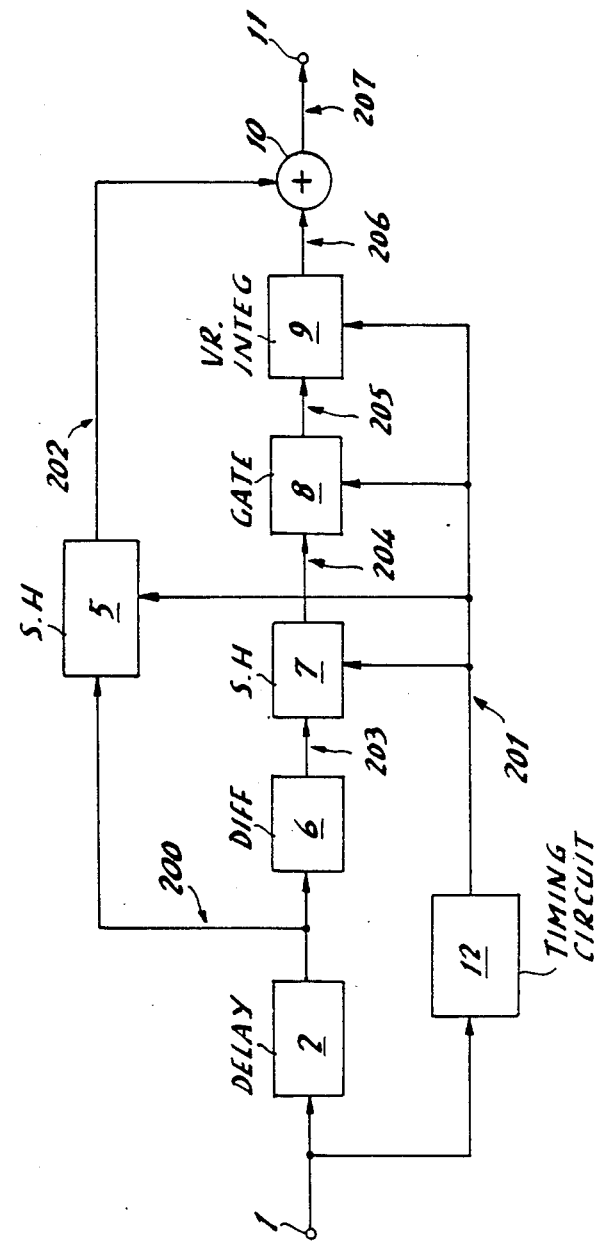

4,626,788

CIRCUIT FOR RECONSTRUCTING NOISE-AFFECTED SIGNALS

BACKGROUND OF THE INVENTION

The present invention relates generally to noise reduction, and in particular to a circuit for reconstructing the portion of an analog signal which is affected by an impulse noise.

One method currently available for suppressing impulse noise involves reducing the transmission gain or shutting off the transmission path as long as the noise is present in the desired signal. Another method involves detecting the amplitude of the desired signal in response to the leading edge of a noise impulse and retaining the detected amplitude in the presence of the impulse noise. While these methods are effective in suppressing impulse noise, the original waveform of the noise-affected part of the impulse is not compensated, resulting in unnatural sound. To overcome this problem modern digital audio systems utilize a linear interpolation technique to predict the original waveform of the noise-affected part by linear interpolation. This type of system requires complicated, expensive circuitry, not suitable for moderate cost equipments.

SUMMARY OF THE INVENTION

Therefore, the primary object of the invention is to provide a circuit that compensates for the noise-affected portion of an analog signal to reconstruct the original waveform in a simple, inexpensive manner.

The circuit of the invention comprises a timing circuit for generating a sampling pulse in response to a noise impulse introduced in the desired signal, a holding circuit for passing the analog signal in the absence of the sampling pulse and holding the analog signal in the presence of the sampling pulse to derive therefrom a modified analog signal, and a differentiator for generating a signal representative of the time-varying rate of change of the analog signal. A sampling circuit is provided for sampling the rate representative signal in response to the occurrence of the sampling pulse and holding the sampled signal for the duration of the sampling pulse to derive therefrom a rectangular pulse, so that the amplitude and polarity of a rectangular pulse represent the gradient and polarity of the noise-affected portion of the signal. The rectangular pulse is integrated linearly at a rate variable as as a function of the amplitude of the rectangular pulse to generate a ramp voltage. An adder combines the ramp voltage with the modified signal to generate a reconstructed signal.

BRIEF DESCRIPTION OF THE DRAWINGS

The present invention will be described in further detail with reference to the accompanying drawings, in which:

FIG. 7 is a block diagram of a further modified embodiment;

DETAILED DESCRIPTION

Figure 1:
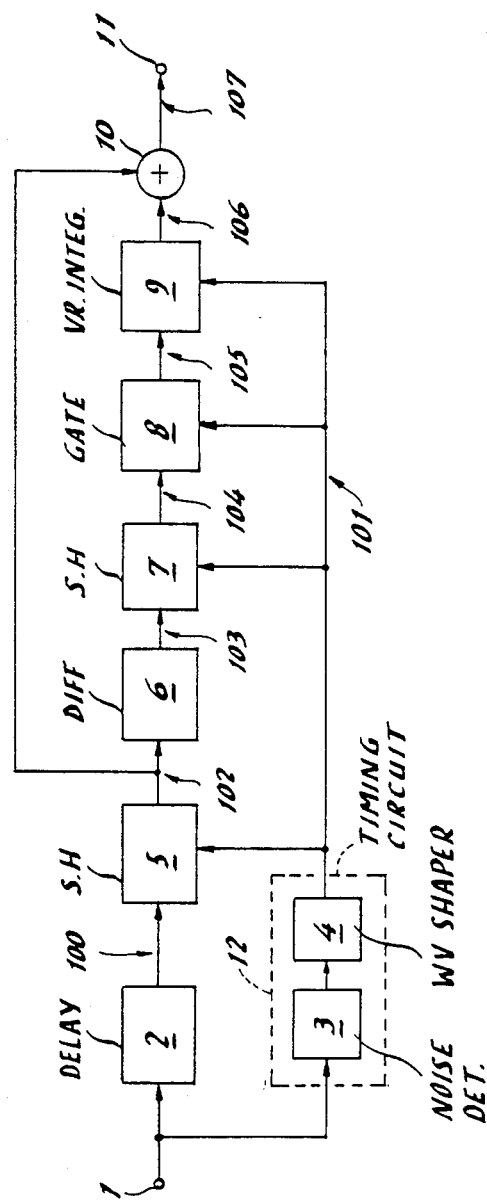
FIG. 1 is a block diagram of a noise suppressor of the invention.
Figure 2:
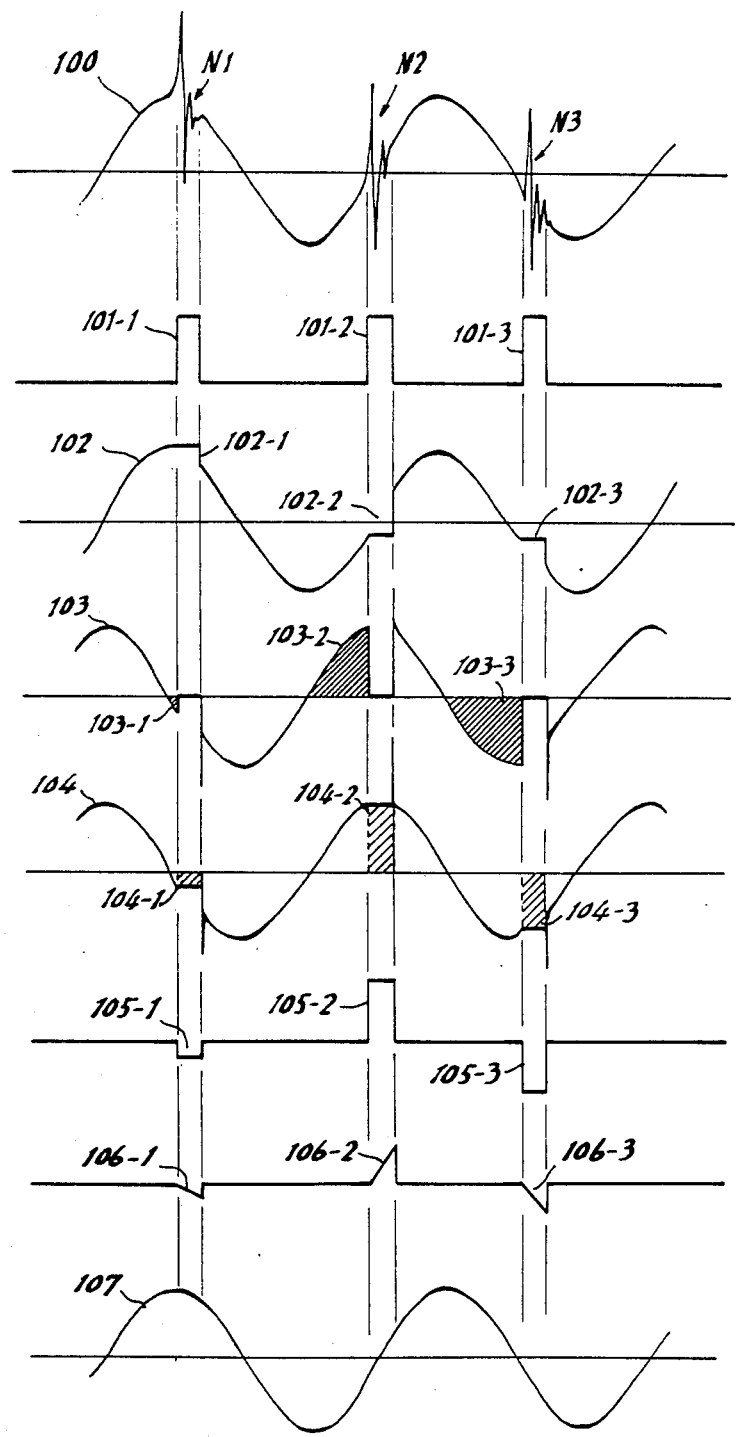
FIG. 2 is a waveform diagram associated with FIG. 1.

Referring now to FIG. 1, there is shown a circuit for eliminating impulse noise according to an embodiment of the invention. An analog audio signal waveform 100, FIG. 2, is applied through input terminal 1 to a noise-triggered timing circuit 12 which includes a noise detector 3 and a waveshaper 4. The noise detector 3 detects peaks that are stronger than the highest peak in the desired signal being received and generates an output which is shaped into a rectangular pulse by the waveshaper 4. The timing circuit 12 thus generates sampling pulses 101-1, 101-2, 101-3, FIG. 2, in response to peaks N1, N2, N3 that occur sporadically in the form of a short burst at various points of the audio signal. For purposes of illustration, the noise peak N1 is assumed to occur at a positive peak of the audio signal where its time-varying rate is minimum. The peak N2 is assumed to occur at a zero-crosspoint of the audio waveform where its time-varying rate is maximum and peak N3 is assumed to occur at a point intermediate a negative peak and a zero-crossing point where the time-varying rate is between the maximum and minimum values. A delay circuit 2 is connected to the input terminal 1 to compensate for the delay time introduced by the timing circuit 12 so that the sampling pulse is exactly time-coincident with the impulse noise. The delayed, noise-affected audio signal is applied to a first sample-and-hold circuit 5. This circuit operates in a passing mode in which the input analog signal is directly applied to its output in the absence of the sampling pulse and switches to a hold mold in which it retains the amplitude of the signal in the presence of the sampling pulse to generate a modified analog signal 102, FIG. 2, having humps 102-1, 102-3 and a dent 102-2.

The waveform 102 is applied to a differentiator 6 to generate output waveform 103, FIG. 2. The sampled portions of the audio signal result in derivative wave portions 103-1, 103-2, 103-3 of different amplitudes and polarities depending on the location of the impulse noise in the audio waveform 100. Since the noise impulse N1 occurs at a positive peak of the signal waveform 100 where the time-varying rate or slope is a minimum, the derivative 103-1 has a minimum amplitude of negative polarity. The derivative 103-2 has a maximum amplitude of positive polarity, while the derivative 103-3 has an intermediate amplitude of negative polarity.

The output of the differentiator 6 is coupled to a second sample-and-hold circuit 7, similar to sample-and-hold circuit 5. Circuit 6 also operates in a passing mode in which an input analog signal thereof is directly applied to its output in the absence of the sampling pulse. Circuit 7 switches to a sample-and-hold mode in which it retains the amplitude of the signal in the presence of the sampling pulse to generate a modified signal waveform 104. The modified signal waveform 104 has retained value portions 104-1, 104-2 and 104-3 which represent the amplitudes of the derivatives 103-1, 103-2 and 103-3, respectively. These retained value portions are extracted from a sampling gate 8 in response to the sampling pulses 101, whereby gate 8 generates a negative-going pulse 105-1 of lowest amplitude, a positive-going pulse 105-2 of maximum amplitude and a negative-going pulse 105-3 of intermediate amplitude.

To the output of sampling gate 8 is connected a variable rate integrator 9 having an integration rate which is a function of the amplitude of an input signal applied thereto. The negative minimum amplitude pulse 104-1 is thus integrated with a minimum rate producing a negative ramp voltage 106-1 of minimum amplitude. Likewise, the positive maximum amplitude pulse 104-2 is integrated with a maximum rate into a positive ramp voltage 106-2 having maximum height, while the negative intermediate amplitude pulse 105-3 is integrated with an intermediate rate into a negative ramp voltage 106-3 of intermediate amplitude. These ramp voltages are used to offset the humps and dent of the sampled voltage 102.

An adder 10 is provided to combine the sampled waveform 102 with the offset ramp voltages 106 to generate a noise-suppressed output waveform 107 for application to an output terminal 11.

Figure 3:
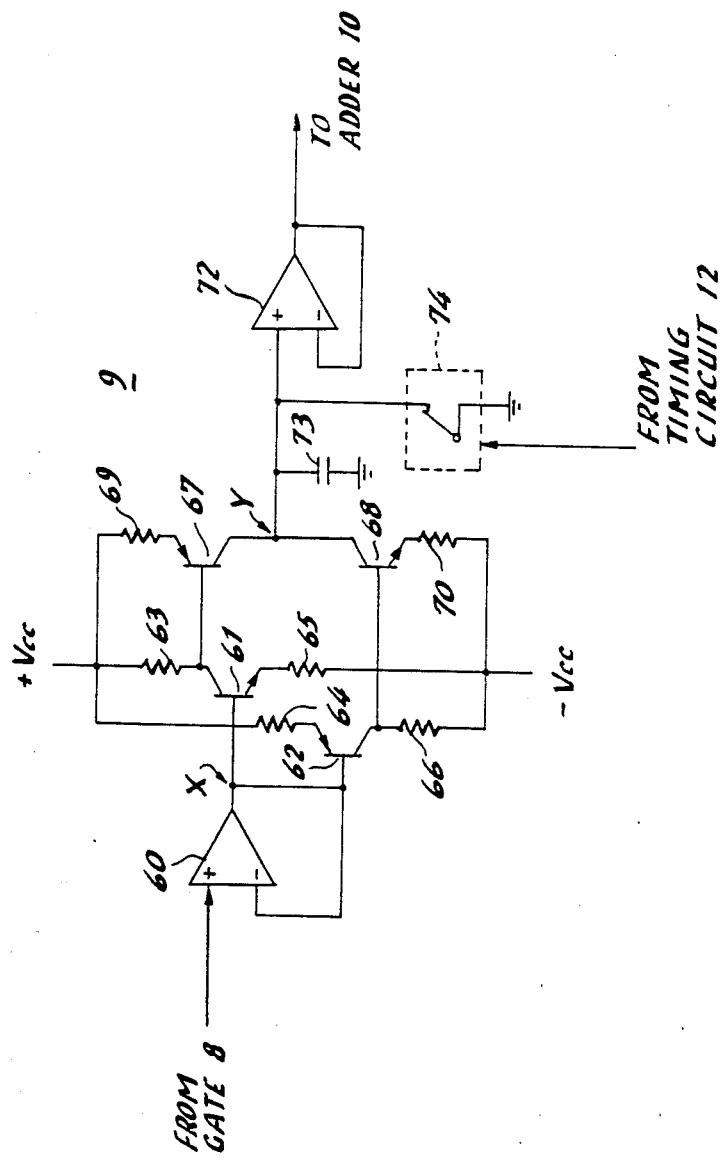
FIG. 3 is a circuit diagram of a variable rate integrator.

FIG. 3 is an illustration of an example of the variable rate integrator 9. The integrator includes a pair of transistors 61 and 62 of opposite conductivity types, the collector of transistor 61 being coupled by a resistor 63 to a positive voltage source +Vcc and the emitter thereof being coupled by a resistor 65 to a negative voltage source −Vcc. The transistor 62 has an emitter coupled by a resistor 64 to the positive voltage source and a collector coupled by a resistor 66 to the negative voltage source. The bases of transistors 61 and 62 are coupled together at a circuit node X which is coupled to the output of an operational amplifier 60 which amplifies the output of sampling gate 8. The collectors of transistors 61 and 62 are coupled respectively to the bases of opposite conductivity type transistors 67 and 68, having collectors coupled together to a second circuit node Y which is coupled to an operational amplifier 72. The emitters of transistors 67 and 68 are respectively connected by integrating resistors 69 and 70 to the positive and negative voltage sources. The transistors 67, 68 and resistors 69, 70 constitute a bidirectional constant current source in which the circuit node Y is at a zero voltage when the potential at circuit node X remains zero. Thus, a positive potential at the node X causes a current to flow through transistor 67 to the circuit node Y, producing a corresponding positive potential at node Y that charges a capacitor 73. A negative potential at the node X in turn causes current to be drained from node Y through transistor 70, producing a corresponding negative potential at node Y that discharges the capacitor 73. Therefore, the capacitor 73 is charged or discharged by a current which is exclusively proportional to the voltage at node X. The capacitor 73 is connected in shunt by a normally closed switch 74 which opens in response to the sampling pulse 101.

After having been amplified by an operational amplifier 60, the negative-going pulse 105-1 drives the transistor 62 into conduction to cause current to be drained from the node Y. Concurrently, the switch 74 is open to allow capacitor 73 to be discharged linearly at a rate proportional to the amplitude of pulse 105-1 to develop the negative ramp voltage 106-1. The positive-going pulse 105-2 forward biases the transistor 61, causing the transistor to generate a current that charges the capacitor 73 linearly at a rate proportional to the amplitude of pulse 105-2 to develop the ramp voltage 106-2. After amplification by amplifier 72, the ramp voltages are applied to the adder 10.

It will be appreciated that the noise suppressor of the invention reconstructs the portion of the signal which has been destroyed by an impulse noise and thus eliminates the feeling of unnaturalness which has been encounted with prior art systems.

Figure 4:
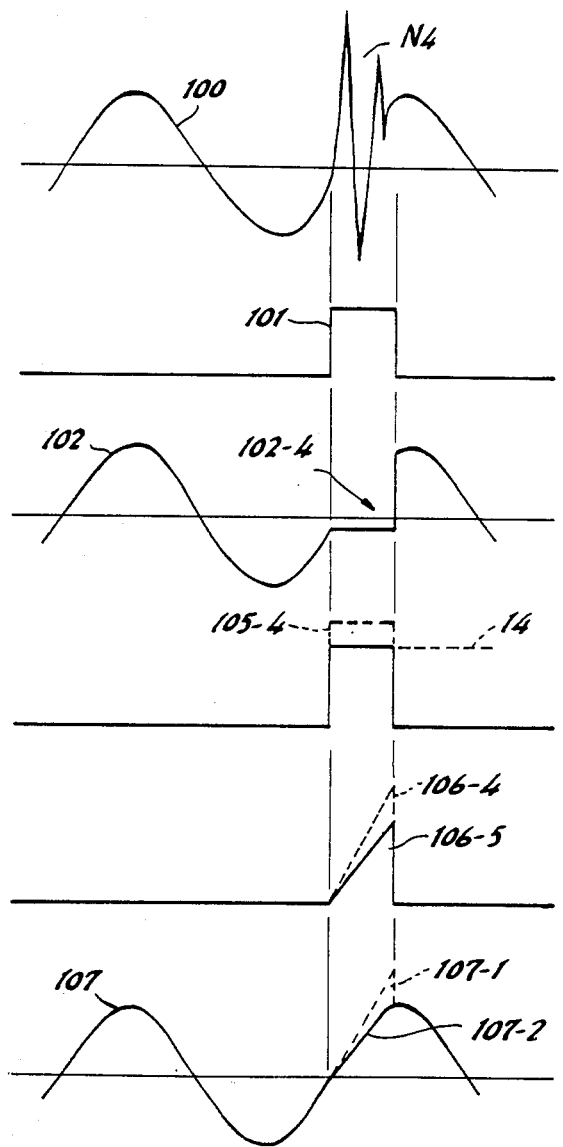
FIG. 4 is a waveform diagram associated with FIG. 1.

In so far as the pulse duration of the noise is significantly smaller than the period of the desired signal, the differentiated signal components 103-1 to 103-3 bear the information that validly represents the time-varying rate of the audio signal. However, as shown in FIG. 4, if the desired signal increases in frequency, the duration of a sampling pulse that occurs in response to a noise impulse N4 becomes long relative to the period of the desired signal, causing a large dent 102-4 to occur in the sampled signal. The differentiation by differentiator 6 results in a gated pulse 105-4 as indicated by broken lines having a large amplitude and a long duration. This in turn results in a ramp voltage 106-4 having an excessive pulse height which would produce a hump 107-1 in the output waveform 107.

Figure 5:
FIG. 5 is a block diagram of a modified embodiment.

To eliminate this problem, the system is provided with a noise suppressor, as illustrated in FIG. 5 to include a level clipper 13 connected to the output of the sampling gate 8. As shown in FIG. 4, the gated pulse 105 is clipped at a level 14 prior to the application to the variable rate integrator 9 if the frequency of the audio signal increases above a predetermined frequency value. The clipping level 14 is so determined that an offset ramp voltage 106-5 has a height equal to that of the dent 102-4, offsetting the noise-affected part with a slope 107-2 which is continuous with the audio signal.

Figure 6:
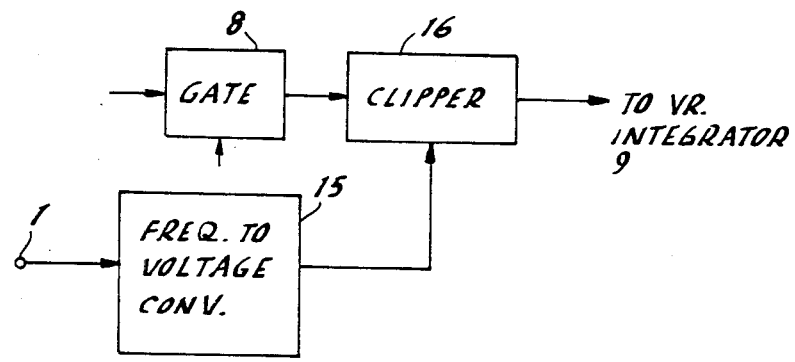
FIG. 6 is a block diagram of another modified embodiment.

FIG. 6 is an illustration of a preferred form of a pulse height clipper that can be used with the system so that the amplitude of a ramp voltage decreases as a function of frequency. In this embodiment, a frequency-to-voltage converter 15 is connected to the input terminal 1 to generate a voltage which is inversely proportional to the frequency of the audio signal. This frequency related voltage is applied to a variable level clipper 16 which is used instead of the fixed level clipper 13. The clipping level 14 thus drops by an amount proportional to the input frequency, so that the amplitude of the offset ramp voltage 106 decreases as a function of the frequency.

The embodiment of FIG. 1 could be modified in various ways. Modified embodiments are shown in FIGS. 7 and 9 in which parts corresponding to those in FIG. 1 are marked with the same numerals as used in FIG. 1.

Figure 8:
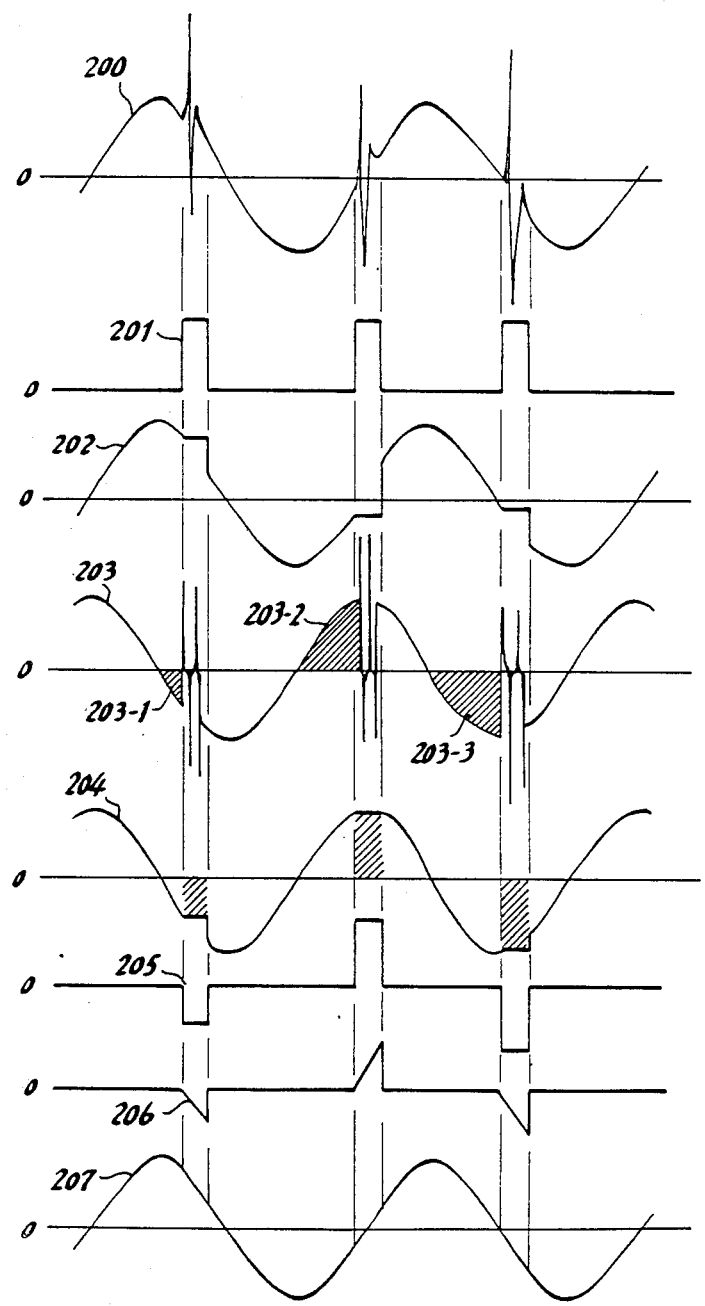
FIG. 8 is a waveform diagram associated with FIG. 7.

The embodiment of FIG. 7 differs from the FIG. 1 embodiment in that the input of the differentiator 6 is connected to the output of the delay circuit 2 instead of being connected to the output of the sample-and-hold circuit 5. As is evident from FIG. 8, the differentiator 6 produces derivative components 203-1, 203-2, 203-3 having amplitudes proportional to the time-varying rate of an input audio signal 200 and having polarities representing the direction of change in signal level. The other waveforms designated by numerals having the same tenth and units of the numerals used in FIG. 2 are substantially identical to the corresponding waveforms.

Figure 9:
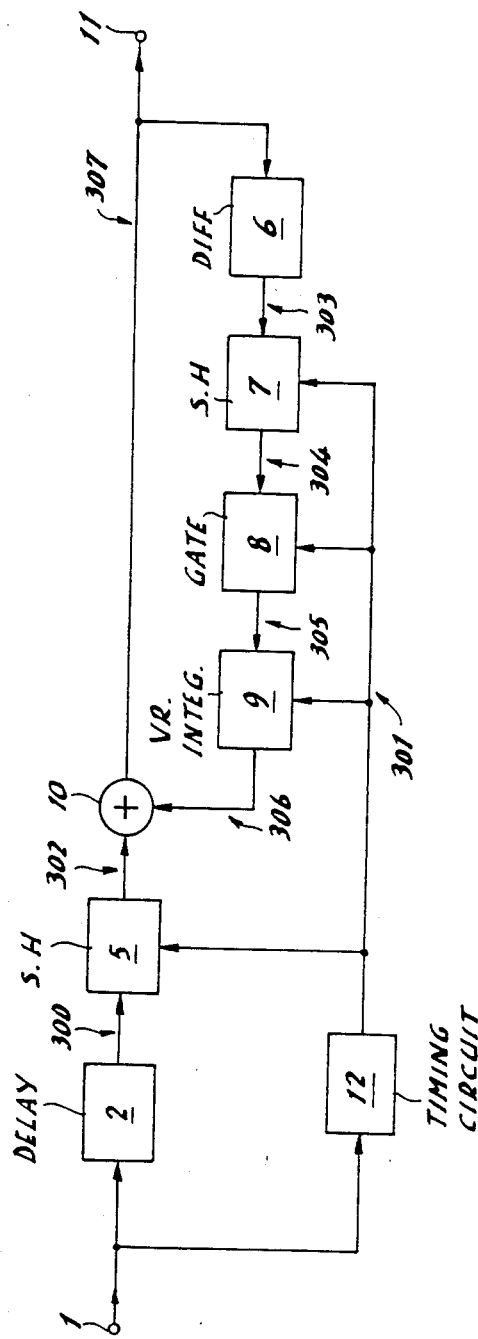
FIG. 9 is a block diagram of a still further modification of the invention.
Figure 10:
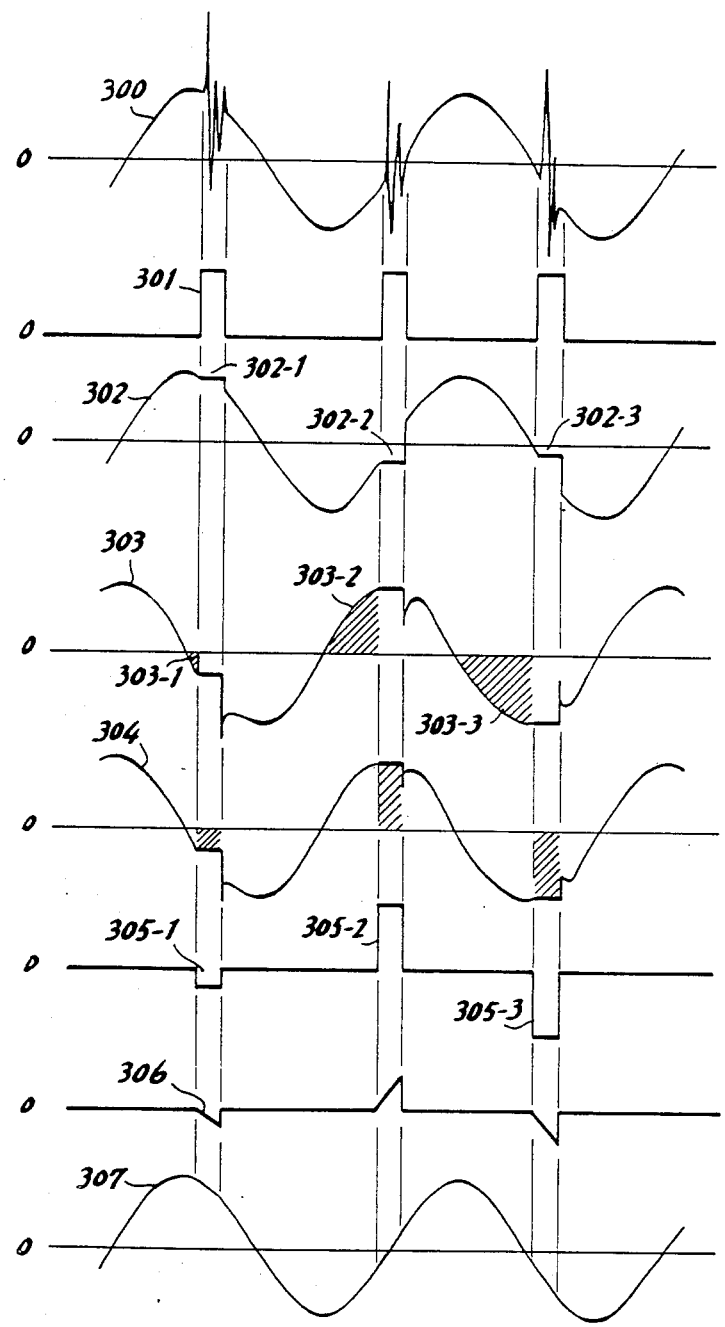
FIG. 10 is a waveform diagram associated with FIG. 9.

The embodiment of FIG. 9 differs from the FIG. 1 embodiment in that the differentiator 6 has an input from the output of adder 10, rather than from the output of sample-and-hold 5. In FIG. 10, waveforms 300, 301, 302 correspond respectively to waveforms 100, 101, 102 of FIG. 2. Since the differentiator 6 differentiates the outputs of the sample-and-hold 5 and integrator 9, the waveform 303 derived therefrom is a combination of a waveform similar to waveform 103, FIG. 2 and a waveform similar to waveform 105, FIG. 2. Thus, the derivative components 303-1, 303-2, 303-3 correspond to waveforms 103-1, 103-2, 103-3 of FIG. 2, respectively, and waveforms 304 to 307 derived respectively from the sample-hold 7, gate 8, integrator 9 and adder 10 correspond to waveforms 104 to 107, respectively.

Figure 11:
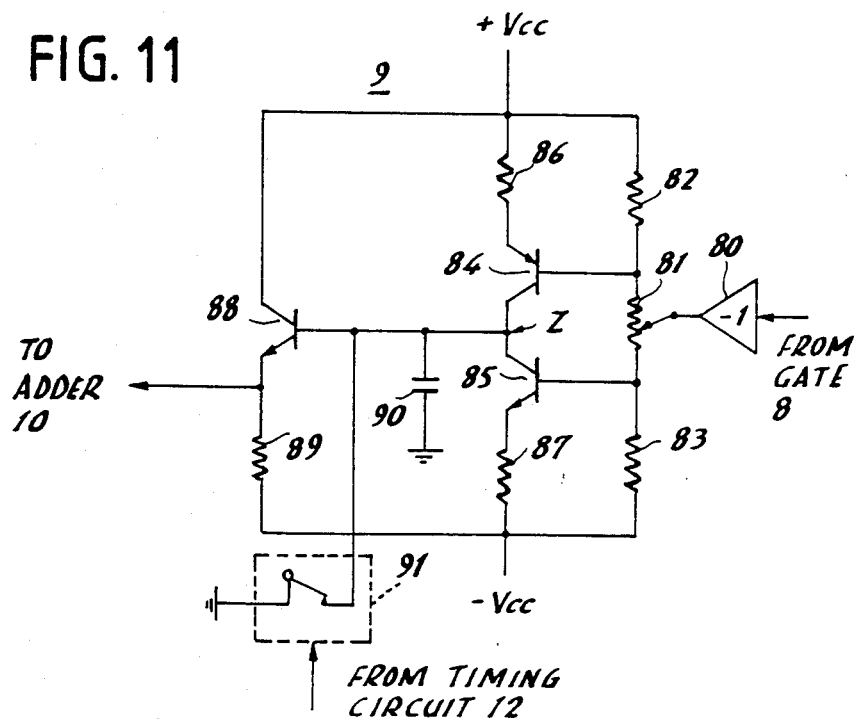
FIG. 11 is a circuit diagram of a modified integrator.

An alternative embodiment of the variable rate integrator 9 is illustrated in FIG. 11. The input signal from the sampling gate 8 is amplified by a unity gain inverter 80 and applied to a wiper tap of a potentiometer 81 connected in series with resistors 82 and 83 between positive and negative voltage sources. The junctions between resistors 81 and 82 and 81 and 83 are respectively coupled to the bases of transistors 84 and 85 of opposite conductivity types which are connected in series with resistors 86 and 87 to the voltage sources to form a bidirectional constant current source. A circuit node Z between the collectors of transistors 84 and 85 is coupled to the base of a transistor 88 which is in series with a load resistor 89 between the voltage sources. The potentiometer 81 is adjusted so that when the input voltage is zero the potential at node Z is always zero.

When the input signal is of positive polarity, a greater current flows through transistor 34 than is drained through transistor 85 causing a positive potential to be derived at node Z to charge capacitor 90 which is in shunt with normally closed switch 91. A negative input signal causes a greater current to be drained through transistor 85 from node Z than is supplied thereto through transistor 84, thus producing a negative potential at node Z that discharges capacitor 90.

What is claimed is:

1. A circuit for suppressing impulse noise imposed on an analog signal, the circuit having an input terminal to which the analog signal is applied and an output terminal, comprising:
    means connected to said input terminal for generating a sampling pulse in response to the impulse noise in said analog signal;
    delay means coupled to said input terminal for delaying said analog signal so that the impulse noise is time-coincident with said sampling pulse;
    a differentiator responsive to an output signal from said delay means;
    first sample-and-hold means connected to be responsive to said analog signal, as derived by said delay means, for generating a waveform which is a replica of the analog signal, as derived by said delay means, when said sampling pulse is absent and for holding said waveform in response to derivation of said sampling pulse;
    second sample-and-hold means connected to said differentiator for generating a rectangular pulse in response to said sampling pulse;
    a resettable integrator connected to said second sample-and-hold means for generating a ramp voltage in response to said sampling pulse, said ramp voltage having a slope variable as a function of the amplitude of said rectangular pulse; and
    a summing circuit for summing said ramp voltage with an output signal from the first sample-and-hold means and applying a summed output signal to said output terminal.

2. A circuit as claimed in claim 1, further comprising means connected to be responsive to said second sample-and-hold means for clipping a portion of the rectangular pulse of said second sample-and-hold means which exceeds a predetermined amplitude, the clipped rectangular pulse being supplied to an input of said resettabe integrator.

3. A circuit as claimed in claim 1, wherein the analog signal is an AC signal having differing frequencis, further comprising means connected to be responsive to said second sample-and-hold means for clipping a portion of the rectangular pulse of said second sample-and-hold means by an amount proportional to the frequency of said analog signal, the clipped rectangular pulse being supplied to an input of said resettabe integrator.

4. A circuit as claimed in claim 1, wherein said resettable integrator comprises:
    a pair of first and second transistors of opposite conductivity type, each having a collector, emitter, base and collector-emitter path, the collector-emitter paths being connected in series with first and second resistors and positive and negative voltage sources to form a circuit node between the collectors of said first and second transistors;
    means for coupling the rectangular pulse of said second sample-and-hold means to bases of said first and second transistors;
    a capacitor coupled to said circuit node; and
    means for causing said capacitor to be charged to a voltage developed at said circuit node in response to said sampling pulse and discharging the capacitor upon the cessation of said sampling pulse.

5. A circuit as claimed in claim 4, wherein said coupling means comprises third and fourth transistors of opposite conductivity types each having a base and collector-emitter emitter collector path, the paths of the third and fourth transistors being connected respectively in series with first and second resistor networks for generating first and second potentials coupled to the bases of said first and second transistors, respectively, the bases of said third and fourth transistors being connected together to be driven by the output of said second sample-and-hold means.

6. A circuit as claimed in claim 5, wherein said integrator further comprises a buffer amplifier connected between the output of said second sample-and-hold means and the bases of said third and fourth transistors.

7. A method for suppressing impulse noise imposed on an analog signal, comprising:
    detecting the impulse noise imposed on said analog signal and in response to the detected impulse noise generating a sampling pulse;
    passing said analog signal when said sampling pulse is absent and holding said analog signal when said sampling pulse is present and generating therefrom a modified analog signal;
    generating a signal having an amplitude representative of a time-varying rate of said modified analog signal;
    detecting the amplitude of said time-varying rate representative signal in response to occurrence of said sampling pulse and holding the detected amplitude during said sampling pulse and deriving therefrom a rectangular pulse;
    integrating said rectangular pulse at a rate variable as a function of the amplitude of said rectangular pulse and deriving therefrom a ramp voltage; and
    summing said ramp voltage with said modified analog signal to reconstruct a portion of said analog signal affected by the impulse noise imposed thereon.

* * * * *